(12) United States Patent
Adachi

(10) Patent No.: US 10,522,435 B2
(45) Date of Patent: Dec. 31, 2019

(54) SEMICONDUCTOR DEVICE AND METHOD OF MANUFACTURING THE SEMICONDUCTOR DEVICE

(71) Applicant: FUJI ELECTRIC CO., LTD., Kawasaki-shi, Kanagawa (JP)

(72) Inventor: Kazuya Adachi, Hino (JP)

(73) Assignee: FUJI ELECTRIC CO., LTD., Kawasaki-shi, Kanagawa (JP)

( * ) Notice: Subject to any disclaimer, the term of this patent is extended or adjusted under 35 U.S.C. 154(b) by 0 days.

(21) Appl. No.: 15/909,992

(22) Filed: Mar. 1, 2018

(65) Prior Publication Data

US 2018/0190554 A1    Jul. 5, 2018

Related U.S. Application Data

(63) Continuation of application No. PCT/JP2017/009296, filed on Mar. 8, 2017.

(30) Foreign Application Priority Data

Mar. 18, 2016    (JP) .................................. 2016-056062

(51) Int. Cl.
*H01L 23/12*    (2006.01)
*H01L 23/48*    (2006.01)
(Continued)

(52) U.S. Cl.
CPC .............. *H01L 23/12* (2013.01); *H01L 23/48* (2013.01); *H01R 4/60* (2013.01); *H01R 12/58* (2013.01); *H05K 1/18* (2013.01)

(58) Field of Classification Search
CPC ....................................................... H05K 1/18
See application file for complete search history.

(56) References Cited

U.S. PATENT DOCUMENTS

| | | | |
|---|---|---|---|
| 2010/0165582 A1 | 7/2010 | Hornkamp | |
| 2013/0334676 A1* | 12/2013 | Kodaira | ................ H01L 23/142 |
| | | | 257/690 |

(Continued)

FOREIGN PATENT DOCUMENTS

| | | |
|---|---|---|
| CN | 101577262 A | 11/2009 |
| JP | 2004-349632 A | 12/2004 |

(Continued)

*Primary Examiner* — Walter H Swanson
(74) *Attorney, Agent, or Firm* — Rabin & Berdo, P.C.

(57) ABSTRACT

On a conductive plate of an insulated substrate, one open end of a main body part of a cylindrical contact member is bonded by solder. In a hollow part of a hollow cylinder shaped external electrode terminal, a part of the other open end side of the main body part of the cylindrical contact member is inserted from an open end of the external electrode terminal. The other end of the external electrode terminal is separated into branches by cuts inserted in a through-hole insertion part. A column surface of the outside of the branches of the external electrode terminal has an arc shape. Pressure in a direction from inside the external electrode terminal toward the outside is applied to the branches of the through-hole insertion part by an auxiliary wedge. With such a configuration, assembly defects accompanying connection of the external electrode terminal and other members may be eliminated.

18 Claims, 9 Drawing Sheets

(51) Int. Cl.
*H01R 4/60* (2006.01)
*H01R 12/58* (2011.01)
*H05K 1/18* (2006.01)

(56) References Cited

U.S. PATENT DOCUMENTS

2014/0332950 A1* 11/2014 Iwata .................. H01L 23/3731
257/712
2015/0380274 A1   12/2015 Yoshimatsu et al.

FOREIGN PATENT DOCUMENTS

| | | |
|---|---|---|
| JP | 2011-150833 A | 8/2011 |
| JP | 2012-231042 A | 11/2012 |
| JP | 2016-012604 A | 1/2016 |

* cited by examiner

SEMICONDUCTOR DEVICE AND METHOD OF MANUFACTURING THE SEMICONDUCTOR DEVICE

CROSS REFERENCE TO RELATED APPLICATIONS

This is a continuation application of International Application PCT/JP2017/009296 filed on Mar. 8, 2017 which claims priority from a Japanese Patent Application No. 2016-056062 filed on Mar. 18, 2016, the contents of both of which are incorporated herein by reference.

BACKGROUND OF THE INVENTION

1. Field of the Invention

Embodiments of the invention relate to a semiconductor device, a metal electrode member, and a method of manufacturing a semiconductor device.

2. Description of the Related Art

Conventionally, for example, a semiconductor device, such as a semiconductor module, has a configuration in which a semiconductor chip and other component members are soldered to a conductive plate on a surface of an insulated circuit board. The conductive plate and an external electrode terminal are electrically connected by fitting the external electrode terminal into a metal member having a hollow cylindrical shape (hereinafter, cylindrical contact member) soldered to the conductive plate on a surface of the insulated circuit board (for example, refer to Japanese Laid-Open Patent Publication No. 2011-150833 and Japanese Laid-Open Patent Publication No. 2012-231042).

When the semiconductor chip on the insulated circuit board and the external electrode terminal are connected, after the cylindrical contact member is mounted on the conductive plate of the insulated circuit board by soldering, a pin-shaped external electrode terminal is press-fitted in to a main body part of the cylindrical contact member, the main body part having a hollow cylindrical shape. An inner diameter (diameter) of the main body part of the cylindrical contact member is slightly smaller than an outer diameter of the external electrode terminal to suit fitting dimensions for fitting with the external electrode terminal.

A configuration of components of a conventional semiconductor module will be described. FIG. 9 is a cross-sectional view of a configuration of components of a conventional semiconductor module. FIG. 10 is a plan view of a planar shape of another end of an external electrode terminal at cutting plane A in FIG. 9. As depicted in FIG. 9, a cylindrical contact member 110 of the conventional semiconductor module has a main body part 101 having a hollow cylindrical shape, and flanges 102, 103 provided at both open ends 101a, 101b of the main body part 101, respectively.

The flange 102 of one open end 101a of the main body part 101 of the cylindrical contact member 110 is bonded by soldering 125 to a conductive plate 122 of a front surface of a layered substrate 120. The layered substrate 120 is constituted by the conductive plate 122 formed on a front surface of a ceramic substrate 121 by a copper (Cu) foil; the layered substrate 120 is further constituted by a copper foil 123 formed on a rear surface of the ceramic substrate 121. The cylindrical contact member 110 is electrically connected to a semiconductor chip (not depicted), via the conductive plate 122 and a non-depicted wire.

One end 111a of an external electrode terminal 111 is press-fit into the main body part 101 (a hollow part 104) of the cylindrical contact member 110 to be fitted to the cylindrical contact member 110 and is thereby fixed. The external electrode terminal 111 is electrically connected to a semiconductor chip 124, via the cylindrical contact member 110. Another end 111b of the external electrode terminal 111 protrudes outside a resin case 126 from a thru-hole 127 of the resin case 126.

Further, the other end 111b of the external electrode terminal 111, at the part protruding outside the resin case 126, is connected to a printed circuit board (PCB) 131 by solder (not depicted). Alternatively, the other end 111b of the external electrode terminal 111, at the part protruding outside the resin case 126, is press-fit into a through-hole 132 of the printed circuit board 131 to be in contact with an electrode (hereinafter, through-hole electrode) 133 provided along an inner wall of the through-hole 132 and is electrically conducted with a circuit part on the printed circuit board 131.

When the external electrode terminal 111 is press-fit into the through-hole 132 of the printed circuit board 131, an outer diameter of the other end 111b of the external electrode terminal 111 is slightly larger than an inner diameter the through-hole electrode 133 provided along an inner wall of the through-hole 132 to suit fitting dimensions for fitting with the through-hole 132. By setting the fitting dimensions in this manner, the external electrode terminal 111 and the through-hole electrode 133 are caused to contact each other due to elastic forces of the external electrode terminal 111 and the through-hole electrode 133.

The external electrode terminal 111, for example, has an edge shape bent at a predetermined angle so as to have line symmetry with respect to a central axis z of the external electrode terminal 111 (for example, a substantially V shape) (FIG. 10), or an edge shape branched plural times with each branch partially jutting out in a protruding shape in a direction x (or direction y, or both directions x, y) orthogonal to the central axis z of the external electrode terminal 111 (for example, refer to Japanese Laid-Open Patent Publication No. 2016-012604). By processing the external electrode terminal 111 to have such an edge shape, the outer diameter of the other end 111b of the external electrode terminal 111 becomes slightly larger than the inner diameter of the through-hole electrode 133 provided on the inner wall of the through-hole 132.

SUMMARY OF THE INVENTION

According to an embodiment of the present invention, a metal electrode member is mounted to an insulated substrate via another metal member bonded by solder to a conductive plate or a semiconductor chip mounted on the insulated substrate, the metal electrode member being configured to externally lead out potential of the conductive plate or the semiconductor chip. The metal electrode member includes a hollow cylinder shape in which the metal member is insertable from one open end among open ends of both ends of the metal electrode member; and an inner diameter enabling fixing to the metal member and contact with at least a part of an outer wall of the metal member inserted in the metal electrode member from the one open end.

In the embodiment, an inner diameter of the metal electrode member is larger than an outer diameter of metal member.

In the embodiment, an inner wall of the metal electrode member is in contact with a protruding part protruding outwardly from an outer wall of the metal member, the inner wall being fixed to the metal member.

In the embodiment, the metal electrode member further includes plural cuts inserted in an end part of the metal electrode member, the end part being of another open end side among the open ends of the both ends of the metal electrode member, the plural cuts being inserted parallel to a central axis, from the other open end; and plural branches separated and formed by the plural cuts inserted in the end part of the other open end side. The end part of the other open end side is inserted in a through-hole of a circuit board.

In the embodiment, the plural branches form a columnar arc shape having a column surface formed by a generatrix extended in a direction parallel to a central axis, from a periphery of an arc shaped surface, the periphery being orthogonal to the central axis.

In the embodiment, the plural branches, by a wedge inserted into the metal electrode member from the other open end, are fixed to an inner wall of the through-hole and are connected to a through-hole electrode having a ring shape and provided along the inner wall of the through-hole.

In the embodiment, the plural branches are fixed to the inner wall of the through-hole by the wedge having a cone shape, the cone shape having on a conical surface, an outer diameter that is a same as an inner diameter of the through-hole electrode.

In the embodiment, an outer diameter of the metal electrode member is smaller than an inner diameter of the through-hole electrode.

According to another embodiment of the present invention, a semiconductor device includes an insulated substrate; any one of a conductive plate or a semiconductor chip mounted on the insulated substrate; a metal member having a hollow cylindrical shape, the metal member having a first open end and a second open end on an opposite side from the first open end, the first open end being bonded by solder to the conductive plate or the semiconductor chip; and a metal electrode member configured to externally lead out potential of the conductive plate or the semiconductor chip, via the metal member, the metal electrode member having a hollow cylinder shape, a third open end and a fourth open end on an opposite side from the third open end, the metal electrode member being fixed to the metal member by a part of the metal member being inserted into the metal electrode member from the third open end, the part of the metal member being of the second open end side.

In the embodiment, an inner diameter of the metal electrode member is larger than an outer diameter of the metal member.

In the embodiment, the metal member has a protruding part protruding outwardly from an outer wall of the metal member, and the metal electrode member has an inner wall in contact with the protruding part and is fixed to the metal member.

In the embodiment, the metal electrode member has: plural cuts inserted in an end part of the metal electrode member, the end part being of the fourth open end side, the plurality of cuts being inserted parallel to a central axis, from the fourth open end; and plural branches separated and formed by the plurality of cuts inserted in the end part of the fourth open end side. The end part of the fourth open end side is inserted in a through-hole of a circuit board.

In the embodiment, the plural branches form a columnar arc shape having a column surface formed by a generatrix extended in a direction parallel to a central axis, from a periphery of an arc shaped surface of the metal electrode member, the periphery being orthogonal to the central axis of the metal electrode member.

In the embodiment, the semiconductor device further includes a wedge inserted into the metal electrode member from the fourth open end of the metal electrode member. The plural branches are fixed to an inner wall of the through-hole by the wedge and are connected to a through-hole electrode provided along the inner wall of the through-hole.

In the embodiment, the wedge has a cone shape having on a conical surface, an outer diameter that is a same as an inner diameter of the through-hole electrode.

In the embodiment, an outer diameter of the metal electrode member is smaller than an inner diameter of the through-hole electrode.

In the embodiment, the metal member has a circular truncated cone shape having an outer diameter that narrows from the first open end side toward the second open end side. An outer diameter of the first open end side of the metal member is at least an inner diameter of the metal electrode member. An outer diameter of the second open end side of the metal member is less than the inner diameter of the metal electrode member.

According to another embodiment of the present invention, a method of manufacturing a semiconductor device including a metal member having a hollow cylindrical shape and one first open end bonded by solder to a conductive plate or a semiconductor chip mounted on an insulated substrate and a metal electrode member configured to externally lead out potential of the conductive plate or the semiconductor via the metal member, includes: bonding the first open end of the metal member on the conductive plate or the semiconductor chip by solder; and inserting into the metal electrode member, a part of the metal member and fixing the metal electrode member to the metal member, the part being on another second open end side of the metal member, the part being inserted from one third open end among open ends of both ends of the metal electrode member having a hollow cylinder shape.

In the embodiment, an inner diameter of the metal electrode member is larger than an outer diameter of the metal member.

In the embodiment, inserting the part of the metal member and fixing the metal electrode member to the metal member includes contacting an inner wall of the metal electrode member and a protruding part protruding outwardly from an outer wall of the metal member, and fixing the metal electrode member to the metal member.

In the embodiment, the method further includes inserting into a through-hole of a circuit board, an end part of the metal electrode member, the end part being on another fourth open end side among open ends of both ends of the metal electrode member; and inserting a wedge into the metal electrode member from the fourth open end of the metal electrode member and fixing the end part of the fourth open end side of the metal electrode member to an inner wall of the through-hole by the wedge, after inserting the end part of the metal electrode member into the through-hole of the circuit board.

In the embodiment, the metal electrode member includes plural branches separated and formed by plural cuts inserted in the end part of the fourth open end side, the plural cuts being inserted from the fourth open end and parallel to a central axis. Inserting the wedge and fixing the end part includes fixing the plural branches to the inner wall of the through-hole by the wedge, and connecting the plural branches to a through-hole electrode provided along the inner wall of the through-hole.

In the embodiment, the plural branches form a columnar arc shape having a column surface formed by a generatrix extended in a direction parallel to a central axis, from a periphery of an arc shaped surface of the metal electrode member, the periphery being orthogonal to the central axis of the metal electrode member.

In the embodiment, the wedge has a cone shape having on a conical surface, an outer diameter that is a same as an inner diameter of the through-hole electrode.

In the embodiment, an outer diameter of the metal electrode member is smaller than an inner diameter of the through-hole electrode.

In the embodiment, the metal member has a circular truncated cone shape having an outer diameter that narrows from the first open end side toward the second open end side. An outer diameter of the first open end side of the metal member is at least an inner diameter of the metal electrode member. An outer diameter of the second open end side of the metal member is less than the inner diameter of the metal electrode member.

Objects, features, and advantages of the present invention are specifically set forth in or will become apparent from the following detailed description of the invention when read in conjunction with the accompanying drawings.

DETAILED DESCRIPTION OF THE INVENTION

Figure 6:
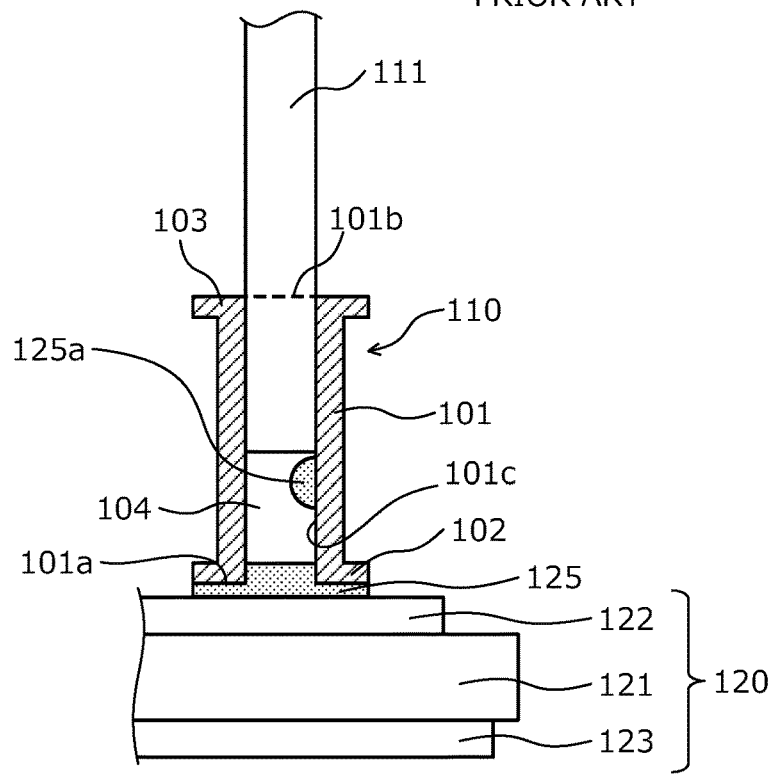
FIG. 6 is a cross-sectional view schematically depicting an example of problems during assembly of a conventional semiconductor module.
Figure 7:
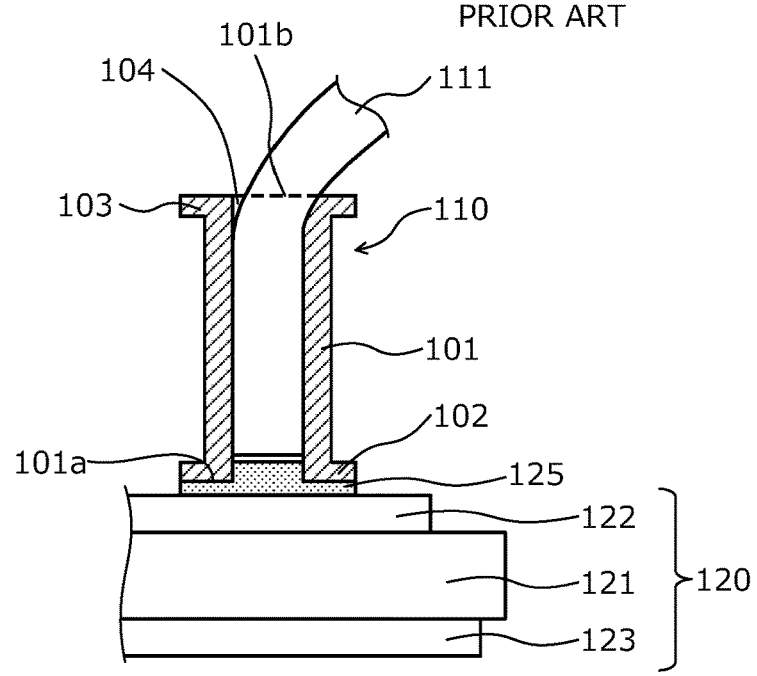
FIG. 7 is a cross-sectional view schematically depicting an example of problems during assembly of the conventional semiconductor module.
Figure 8:
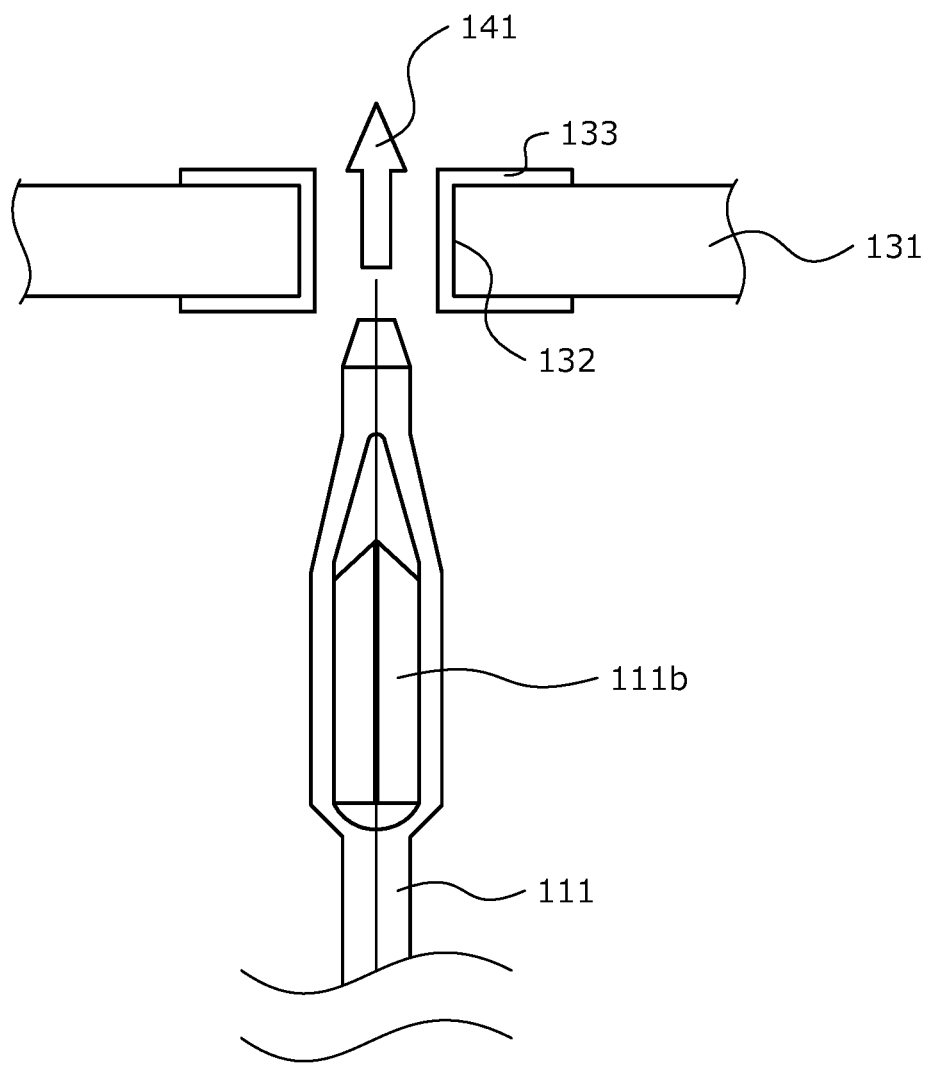
FIG. 8 is a cross-sectional view schematically depicting a state of the conventional semiconductor module during assembly.
Figure 9:
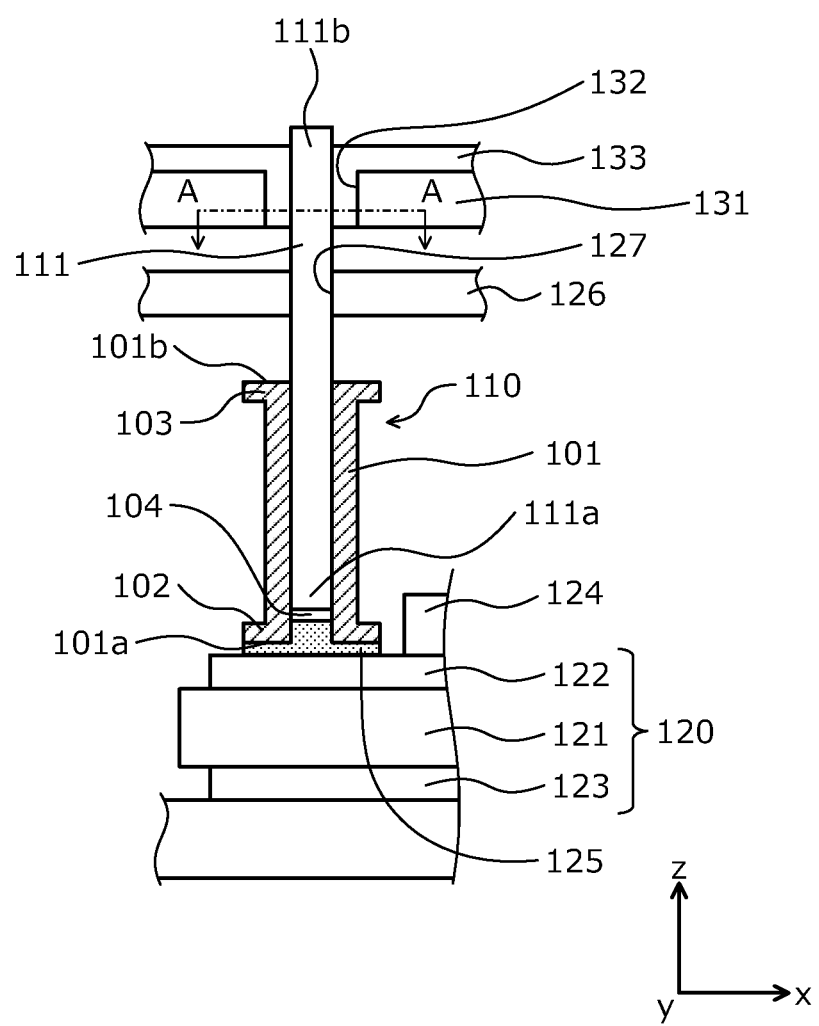
FIG. 9 is a cross-sectional view of a configuration of components of a conventional semiconductor module.

Problems related to the convention semiconductor module will be described. The following problems arise with the conventional semiconductor module depicted in FIGS. 9 and 10, and having the configuration in which the external electrode terminal 111 is fitted by being press-fitted into the main body part 101 of the cylindrical contact member 110. FIGS. 6 and 7 are cross-sectional views schematically depicting an example of problems during assembly of the conventional semiconductor module. FIG. 8 is a cross-sectional view schematically depicting a state of the conventional semiconductor module during assembly. FIG. 8 depicts a state during insertion 141 of the external electrode terminal 111 into the through-hole 132 of the printed circuit board 131.

As for a first problem, due to solderability (wetting) when the cylindrical contact member 110 is soldered on the layered substrate 120, a defect occurs when the external electrode terminal 111 is press-fit into the main body part 101 of the cylindrical contact member 110 (FIGS. 6 and 7). When the flange 102 of the one open end 101a of the main body part 101 of the cylindrical contact member 110 is bonded on the layered substrate 120 by the soldering 125, solder 125a crawls to or is dispersed to an inner wall 101c of the main body part 101 due to capillary action.

In a case of crawling or dispersion during the soldering 125, the external electrode terminal 111 cannot be inserted beyond (on the conductive plate 122 side) the solder 125a attached to the inner wall 101c of the main body part 101 (FIG. 6). Further, when the external electrode terminal 111 is press-fitted, load is placed on the external electrode terminal 111 at the location where the solder 125a is attached to the inner wall 101c of the main body part 101. As a result, the external electrode terminal 111 is bent or broken (FIG. 7).

Figure 10:
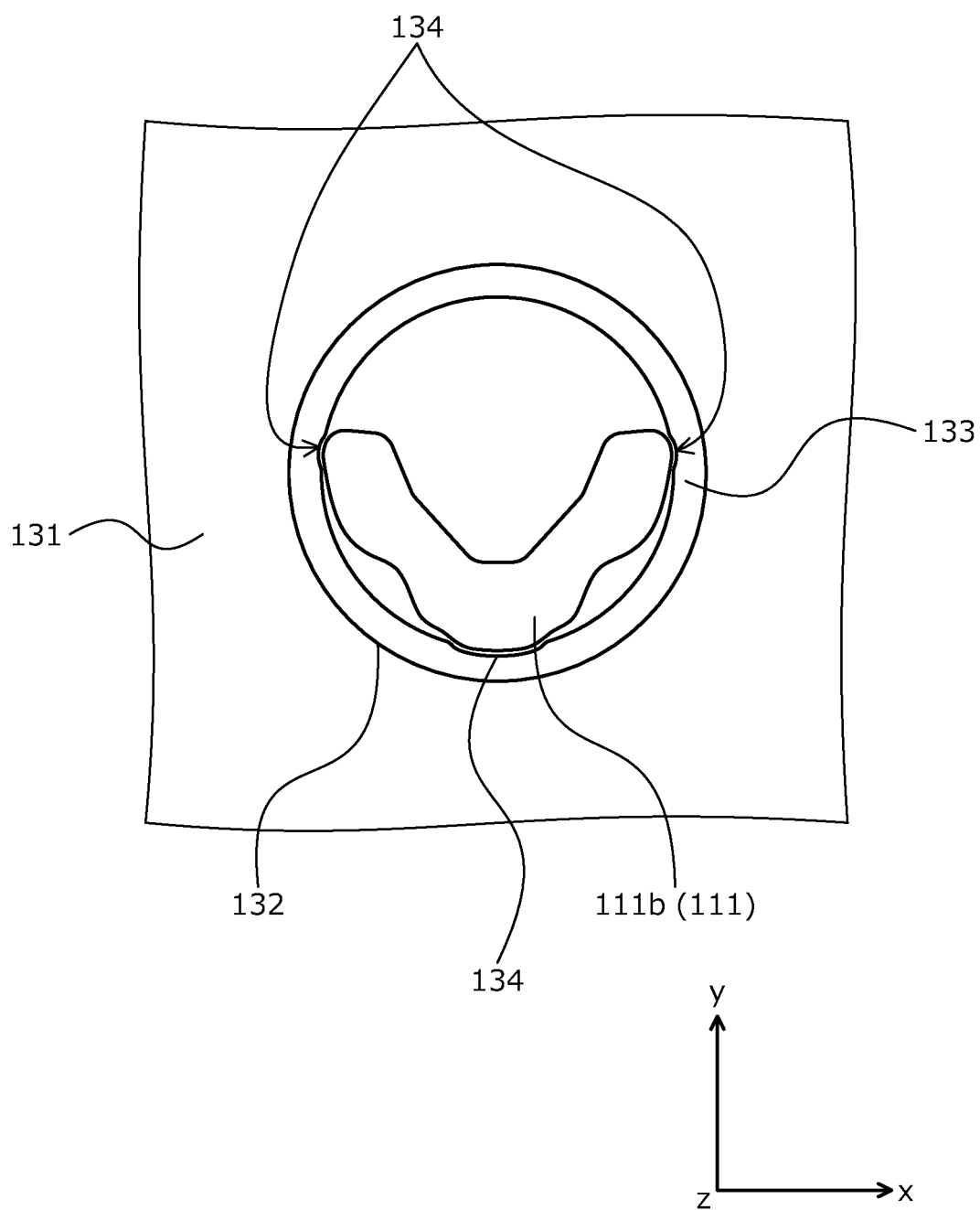
FIG. 10 is a plan view of a planar shape of another end of an external electrode terminal at cutting plane A in FIG. 9.

As for a second problem, since the outer diameter of the other end 111b of the external electrode terminal 111 is designed to be slightly larger than the inner diameter of the through-hole electrode 133, a defect occurs during the insertion 141 of the external electrode terminal 111 into the through-hole 132 of the printed circuit board 131 (FIGS. 8 and 10). A direction indicted by an arrow in FIG. 8 indicates a direction of the insertion 141 of the external electrode terminal 111. The external electrode terminal 111 having an edge shape bent into a substantially V-shape to have line symmetry with respect to the central axis z of the external electrode terminal 111 (refer to FIG. 10) will be described as an example.

With the other end 111b of the external electrode terminal 111 bent into a substantially V-shape in point contact with the through-hole electrode 133, the external electrode terminal 111 is inserted into the through-hole 132 of the printed circuit board 131 (the insertion 141). Therefore, the through-hole electrode 133 is scraped and damaged by parts 134 in point contact with the external electrode terminal 111. Further, in a case where shavings of the through-hole electrode 133 are produced, the shavings may adhere to the printed circuit board 131 and the semiconductor module, reducing the insulating property.

Embodiments of a semiconductor device, a metal electrode member, and a method of manufacturing a semiconductor device according to the present invention will be described in detail with reference to the accompanying drawings. In the description and the accompanying drawings, identical components are given the same reference characters and are not redundantly described.

Figure 1:
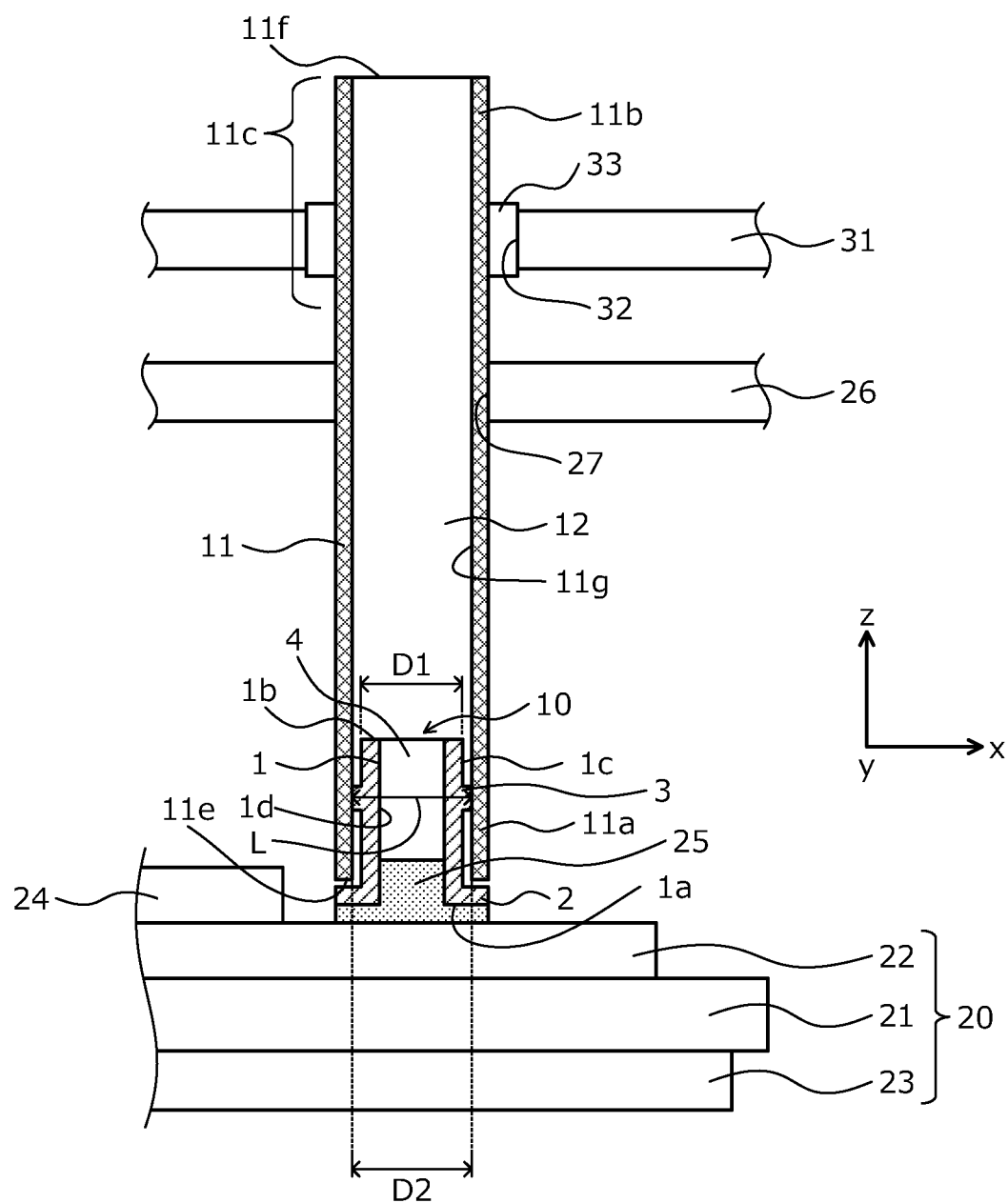
FIG. 1 is a cross-sectional view of a structure of a semiconductor device according to a first embodiment.
Figure 2A:
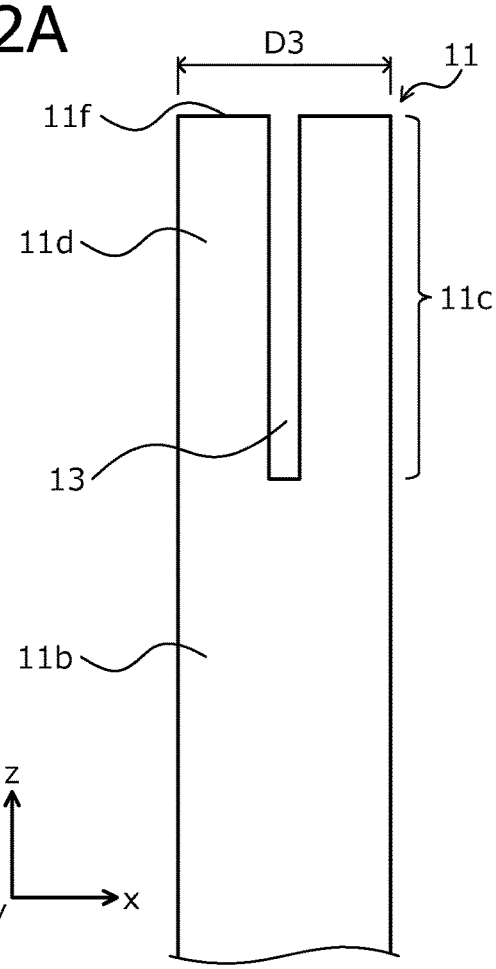
FIG. 2A is a diagram depicting a part of the structure in FIG. 1 in detail.
Figure 2B:
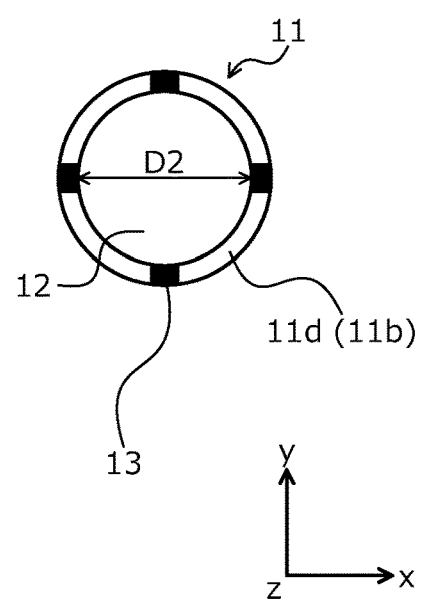
FIG. 2B is a diagram depicting a part of the structure in FIG. 1 in detail.
Figure 3:
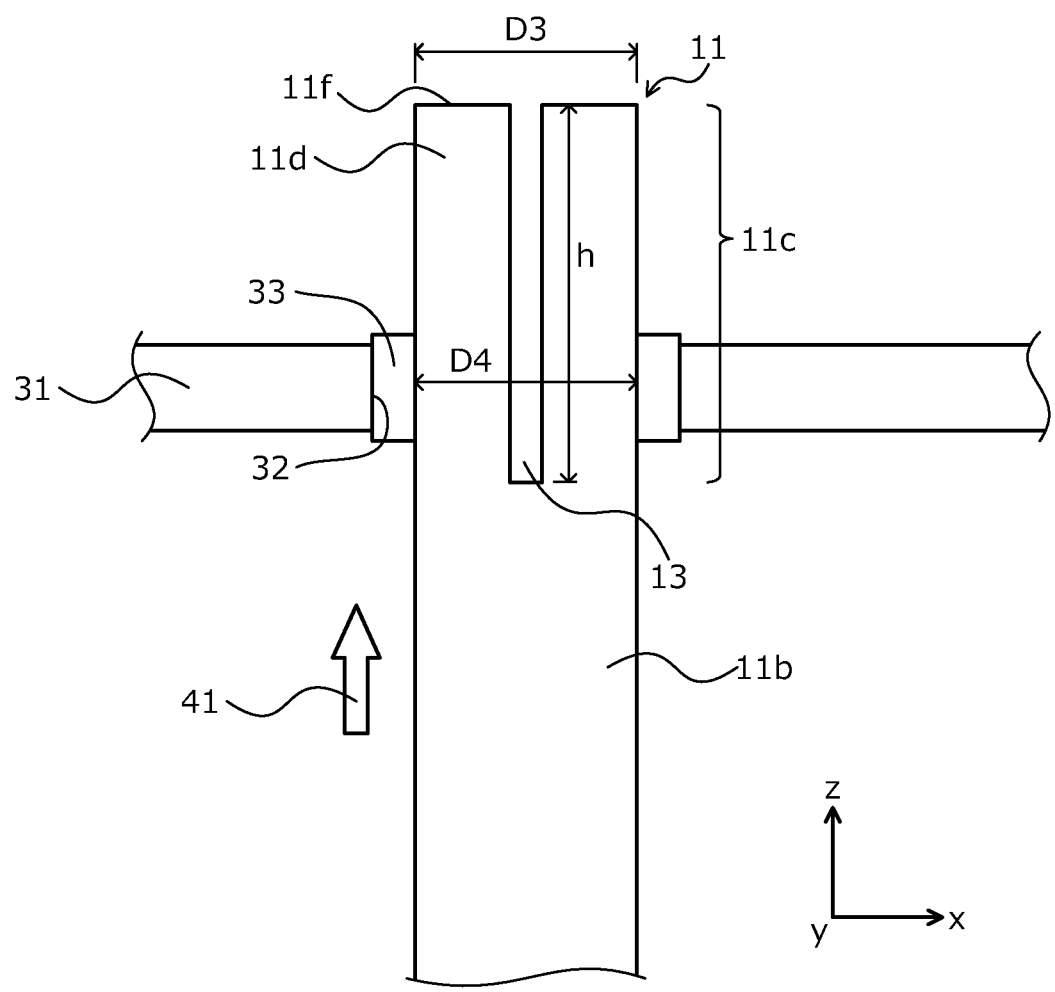
FIG. 3 is a cross-sectional view of the semiconductor device according to the first embodiment during manufacture.
Figure 4A:
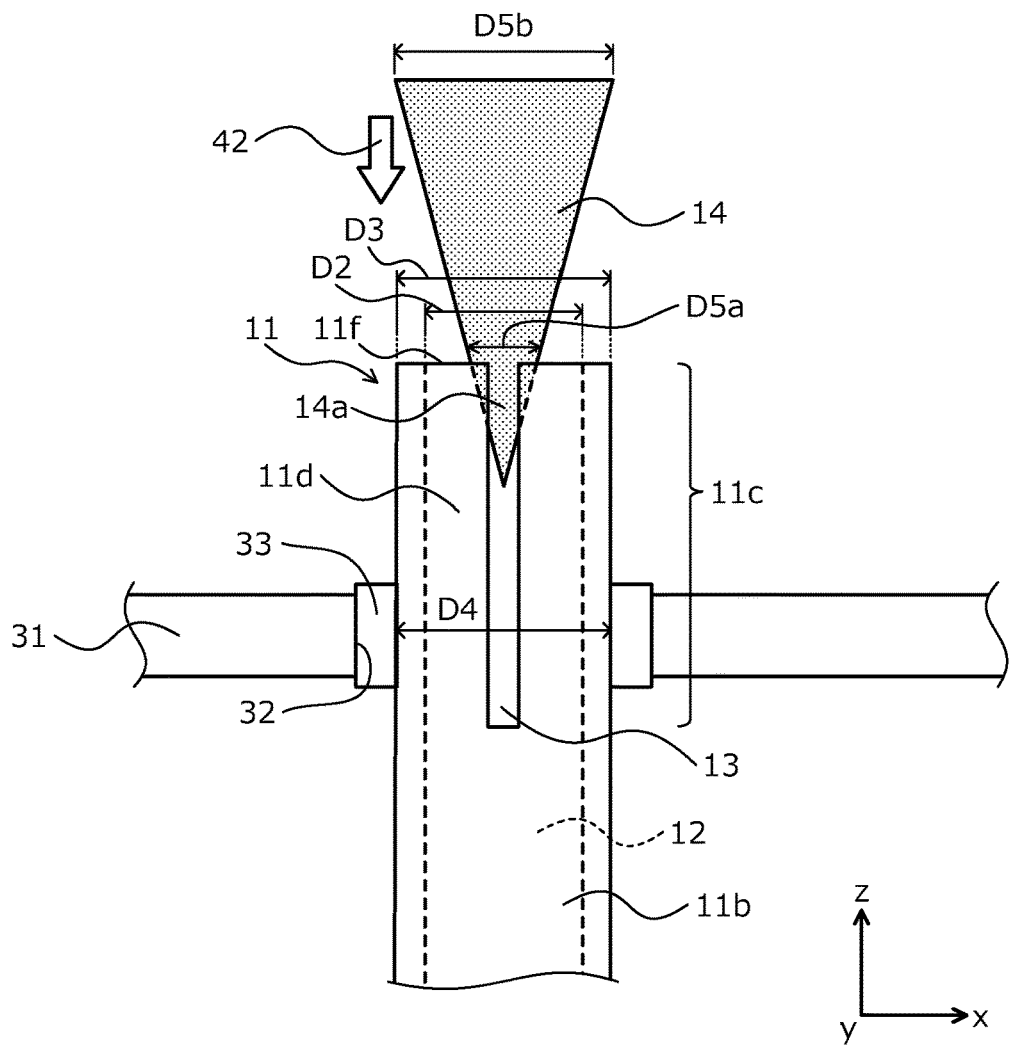
FIG. 4A is a cross-sectional view of the semiconductor device according to the first embodiment during manufacture.
Figure 4B:
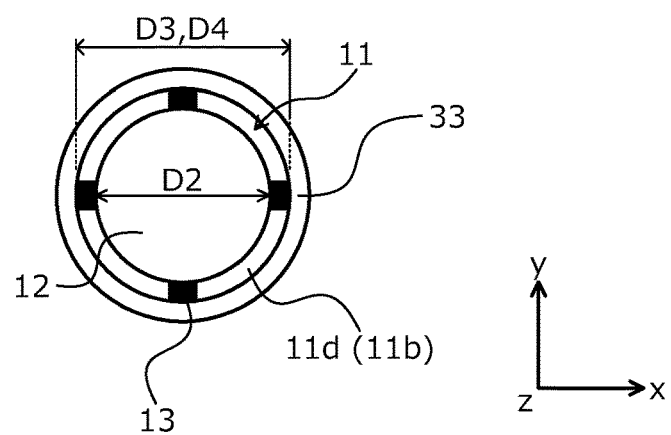
FIG. 4B is a cross-sectional view of the semiconductor device according to the first embodiment during manufacture.

A structure of the semiconductor device according to a first embodiment will be described. FIG. 1 is a cross-sectional view of a structure of the semiconductor device according to the first embodiment. FIGS. 2A and 2B are diagrams depicting a part of the structure in FIG. 1 in detail. FIGS. 2A and 2B depict an external shape of a through-hole insertion part 11c of an external electrode terminal (metal electrode member) 11. FIGS. 3, 4A and 4B are cross-sectional views of the semiconductor device according to the first embodiment during manufacture. FIG. 3 depicts a state at the time of insertion 41 of the external electrode terminal 11 into a through-hole 32 of a printed circuit board 31. FIGS. 4A and 4B depict a state at the time of insertion 42 of an auxiliary wedge 14 into the hollow part 12 of the external electrode terminal 11.

The semiconductor device according to the first embodiment depicted in FIG. 1 is a semiconductor module having a configuration in which a semiconductor chip 24 and other component members, etc. are bonded by solder (not depicted) to a conductive plate 22 on a front surface of a layered substrate 20, in a predetermined planar layout based on design conditions. The layered substrate 20, for example, is a circuit board where the conductive plate 22 on which an electrode pattern is formed by a copper (Cu) foil is stacked on a front surface of an insulated substrate 21 and a copper foil 23 is stacked on a rear surface of the insulated substrate 21. The conductive plate 22 and the copper foil 23 may be nickel (Ni) plated.

In the insulated substrate 21, for example, a ceramic such as aluminum oxide ($Al_2O_3$), aluminum nitride (AlN), silicon nitride ($Si_3N_4$), etc. is used. The copper foil 23 on the rear surface of the layered substrate 20, for example, is soldered to a heat sink (not depicted). A rear surface of the semiconductor chip 24 is bonded to the conductive plate 22 on the layered substrate 20 by solder (not depicted). An electrode (hereinafter, front electrode (not depicted)) provided on a front surface of the semiconductor chip 24 is electrically connected to the conductive plate 22, via an aluminum (Al) wire (not depicted).

One open end (one open part (first open end) of a hollow part 4 (lower end in figure)) 1a of a main body part 1 of a cylindrical contact member (metal member) 10 is bonded by solder 25 to the conductive plate 22 on the layered substrate 20. A paste solder such a cream solder having, for example, a predetermined viscosity may be used as the solder 25 (similarly for solder bonding other members to each other). The cylindrical contact member 10 is electrically connected to the front electrode of the semiconductor chip 24, via the conductive plate 22 and a wire (not depicted). The cylindrical contact member 10 may be soldered directly to the front electrode of the semiconductor chip 24.

The cylindrical contact member 10 is a metal member that includes the main body part 1 having a hollow cylindrical shape, a flange (circumferential edge) 2 provided at the one open end 1a of the main body part 1, and a protruding part 3 provided at an outer wall 1c of the main body part 1. A material of the cylindrical contact member 10 may be a material having favorable conductivity, a material satisfying a predetermined strength and favorably bondable with the solder 25. In particular, the material of the cylindrical contact member 10 may be, for example, copper or a copper alloy. Outside the main body part 1, the external electrode terminal 11 having a hollow cylindrical shape surrounding a periphery of the main body part 1 and in contact with the main body part 1 is arranged.

The main body part 1 is a hollow, for example, substantially cylindrical column shaped member. The main body part 1 has a predetermined length enabling the external electrode terminal 11 to be stably fixed to an outer side of the main body part 1 so as to surround the main body part 1. An outer diameter (diameter) D1 of the main body part 1 is slightly smaller than an inner diameter D2 of the external electrode terminal 11 (D1<D2). The one open end (lower end in figure) 1a of the main body part 1 is closed by the solder 25 applied to the conductive plate 22 on the layered substrate 20. In other words, an end of the one open end 1a of the main body part 1 is a bonding surface for the solder 25.

Although the one open end 1a of the main body part 1 need not be completely closed by the solder 25, the flange 2 and the conductive plate 22 may be soldered together. Another open end 1b (other open part (second open end) of the hollow part 4 (upper end in figure)) of the main body part 1 is open. Although crawling of the solder 25 occurs at an inner wall 1d of the main body part 1 when the main body part 1 is soldered to the conductive plate 22 on the layered substrate 20, in the present example, nothing is inserted into the hollow part 4 of the main body part 1. Therefore, mounting defects due to crawling of the solder 25 to the inner wall 1d of the main body part 1 may be avoided.

The flange 2 has, from the one open end 1a of the main body part 1, an overhanging ring shape (collar shape) of a predetermined width outside the main body part 1 in a direction x (or a direction y, or both directions x and y) orthogonal to a central axis z of the main body part 1, the flange 2 being provided, for example, along the entire periphery of the outer wall 1c of the main body part 1. The flange 2 is bonded by the solder 25 to the conductive plate 22 on the layered substrate 2. At the other open end 1b of the main body part 1, no flange is provided and the outer diameter D1 of the main body part 1 is substantially a same dimension at parts other than the flange 2 and the protruding part 3.

The protruding part 3 protrudes in the direction x (or the direction y, or both the directions x, y) orthogonal to the central axis z of the main body part 1 to have a predetermined width (hereinafter, protruding width). Provided the protruding part 3 enables the external electrode terminal 11 to be fixed stably, for example, the protruding part 3 may be provided at a minimum of two or more positions at a same height as the outer wall 1c of the main body part 1, separated from each other. The protruding part 3 may be provided in a ring shape along the entire outer wall 1c of the main body part 1. The protruding part 3 may be formed by a member separate from the main body part 1. The protruding part 3 may be formed by deforming the main body part 1.

An outer diameter L of a part of the main body part 1 where the protruding part 3 is provided may satisfy, for example, D2+0.0 [mm]<L≤D2+0.1 [mm] with respect to the inner diameter D2 of the external electrode terminal 11. As a result, the external electrode terminal 11 is fixed to the outer wall of the main body part 1, preventing disengagement of the external electrode terminal 11. Although FIG. 1 depicts a case where the height of the position of the protruding part 3 as a height of a substantially intermediate position of the outer wall 1c of the main body part 1, the height of position of the protruding part 3 may be variously changed and, for example, may be arranged at the other open end 1b of the main body part 1.

The external electrode terminal 11 is a hollow, for example, substantially cylindrical column shaped member. A material of the external electrode terminal 11 may be, for example, copper or a copper alloy. The external electrode terminal 11 is connected to the protruding part 3 of the outer wall of the main body part 1 of the cylindrical contact member 10 and is electrically connected to the conductive plate 22 or the front electrode of the semiconductor chip 24 on the layered substrate 20, via the cylindrical contact member 10. FIG. 1 depicts a state in which the cylindrical contact member 10 and the conductive plate 22 are bonded by the solder 25. In particular, a part of the cylindrical contact member 10, the part on the other open end 1b of the main body part 1, is inserted into the hollow part 12 of the external electrode terminal 11, from an open end (one open part (third open end) of the hollow part 12 (lower end in FIG. 11*e* of one end 11*a* of the external electrode terminal 11.

For example, a part of the cylindrical contact member 10 other than the flange 2 is substantially entirely inserted in the hollow part 12 of the external electrode terminal 11. The protruding part 3 provided on the outer wall 1*c* of the main body part 1 of the cylindrical contact member 10 is fitted with an inner wall 11*g* of the external electrode terminal 11, whereby the external electrode terminal 11 is fixed to the outside of the main body part 1 of the cylindrical contact member 10. The outer wall 1*c* of the main body part 1 of the cylindrical contact member 10 may be in contact with the inner wall 11*g* of the external electrode terminal 11. The open end 11*e* of the one end 11*a* of the external electrode terminal 11 needs not be in contact with the flange 2 of the cylindrical contact member 10. The flange 2 is included on the cylindrical contact member 10, whereby a path along which the solder 25 crawls on the outside of the main body part 1 becomes longer and by further providing the protruding part 3, a gap between an outer side of the main body part 1 and an inner side of the external electrode terminal 11 may be formed. The structure in which the cylindrical contact member 10 and the external electrode terminal 11 are assemble enables mounting defects due to crawling of the solder 25 to the outer wall 1*c* of the main body part 1 to be avoided.

Another end 11*b* of the external electrode terminal 11, for example, protrudes outside a case made of resin (hereinafter, resin case) 26, from a thru-hole 27 of the resin case 26. A part of the other end 11*b* of the external electrode terminal 11, the part protruding outside the resin case 26, is inserted into the through-hole 32 of the printed circuit board 31 and is in contact with an electrode (through-hole electrode) 33 provided along the inner wall of the through-hole 32. Although an overall shape of the resin case 26 is not depicted, the resin case 26 is a cover shaped member that covers a surface of the layered substrate 20 on the conductive plate 22 side. Members on the surface of the layered substrate 20 on the conductive plate 22 side are surrounded by and housed by the resin case 26.

Further, as described hereinafter, the other end 11*b* of the external electrode terminal 11 is fixed to the through-hole 32 of the printed circuit board 31 by the auxiliary wedge 14 inserted (the insertion 42) into the hollow part 12 of the external electrode terminal 11 (refer to FIG. 4A). In the through-hole 32 of the printed circuit board 31, the other end 11*b* of the external electrode terminal 11 is in contact with an inner side of the through-hole electrode 33, which has a substantially ring shape (circular frame shape). The external electrode terminal 11 and the circuit part (not depicted) on the printed circuit board 31 are electrically conducted via the through-hole electrode 33. The printed circuit board 31 and the conductive plate 22 on the layered substrate 20 face each other and sandwich the external electrode terminal 11.

A planar shape of the external electrode terminal 11 as viewed from the other end 11*b* side has, for example, a substantially ring shape (circular frame shape). A part of the other end 11*b* of the external electrode terminal 11, the part (hereinafter, through-hole insertion part) 11*c* inserted into the through-hole 32 of the printed circuit board 31 has one cut 13 or more parallel to the central axis z of the external electrode terminal 11 (FIGS. 2A and 2B) FIG. 2A depicts a cross-sectional view of the other end 11*b* of the external electrode terminal 11 as viewed from the direction x (or the direction y) orthogonal to the central axis z of the external electrode terminal 11 and FIG. 2B depicts a planar shape of the external electrode terminal 11 as viewed from the other end 11*b* side.

The cut 13 has a substantially rectangular shape toward the one end 11*a*, from an open end ((other open part of the hollow part 12) (fourth open end) of the other end 11*b* of the external electrode terminal 11 (upper end in FIG. 11*f*. The cut 13, for example, enters the external electrode terminal 11 to a depth h, reaching the layered substrate 20 side of the printed circuit board 31 fixing the external electrode terminal 11. The through-hole insertion part 11*c* of the external electrode terminal 11 is separated into plural branches 11*d* by the cut 13. FIGS. 2A and 2B depict a case where four of the cuts 13 (black parts in FIG. 2B) are inserted in the other end 11*b* of the external electrode terminal 11 at equal intervals (i.e., 90 degree intervals), separating the through-hole insertion part 11*c* of the external electrode terminal 11 into the four branches 11*d*.

Each of the branches 11*d* of the through-hole insertion part 11*c* of the external electrode terminal 11 has a columnar arc shape having a column surface described by a generatrix extended from a periphery of an arc shaped surface of the external electrode terminal 11 (the periphery being orthogonal to the central axis z), in a direction parallel to the central axis z of the external electrode terminal 11. In other words, an outer diameter D3 of the external electrode terminal 11 is substantially uniform along a direction parallel to the central axis z of the external electrode terminal 11. On the column surface (outer wall) on the outer side of the branch 11*d* of the through-hole insertion part 11*c* of the external electrode terminal 11, partial protrusions in the directions x, y orthogonal to the central axis z of the external electrode terminal 11 are not present. Further, the column surface on the outer side of the branch 11*d* of the through-hole insertion part 11*c* of the external electrode terminal 11 is a rounded arc shape (rounded shape).

In other words, on the column surface on the outer side of the branch 11*d* of the through-hole insertion part 11*c* of the external electrode terminal 11, no protrusions or corner portions are present that scrape off the through-hole electrode 33 at the time of the insertion 41 of the external electrode terminal 11 into the through-hole 32 of the printed circuit board 31. Therefore, at the time of the insertion 41 of the external electrode terminal 11 into the through-hole 32 of the printed circuit board 31, the external electrode terminal 11 and the through-hole electrode 33 are in surface contact. As a result, at the time of the insertion 41 of the through-hole insertion part 11*c* of the external electrode terminal 11 into the through-hole 32 of the printed circuit board 31, scraping off of the through-hole electrode 33 may be suppressed (FIG. 3). A direction indicated by an arrow in FIG. 3 is a direction of the insertion 41 of the external electrode terminal 11.

Further, the outer diameter D3 of the external electrode terminal 11 may be smaller than an inner diameter D4 of the through-hole electrode 33 (D3<D4). As a result, at the time of the insertion 41 of the external electrode terminal 11 into the through-hole 32 of the printed circuit board 31, the branches 11*d* of the through-hole insertion part 11*c* of the external electrode terminal 11 and the through-hole electrode 33 do not contact each other. Therefore, the insertion 41 of the through-hole insertion part 11*c* of the external electrode terminal 11 into the through-hole 32 of the printed circuit board 31 without scraping off the through-hole electrode 33 is possible.

In the through-hole insertion part 11*c* of the external electrode terminal 11, a constant pressure is applied in a direction from the inside of the external electrode terminal 11 toward the outside so that the external electrode terminal 11 is in contact with the through-hole electrode 33 and the external electrode terminal 11 is not easily removed from the printed circuit board 31. For example, the wedge (hereinafter, auxiliary wedge) 14 is inserted (the insertion 42) into the hollow part 12 of the external electrode terminal 11, from the open end 11f of the other end 11b of the external electrode terminal 11 (FIG. 4A). The auxiliary wedge 14 is fixed by the through-hole insertion part 11c of the external electrode terminal 11. A direction of an arrow in FIG. 4A is a direction of the insertion 42 of the auxiliary wedge 14. In FIG. 4A, the auxiliary wedge 14 is indicated by hatching.

The auxiliary wedge 14 has, for example, a substantially conical shape in which compared to an outer diameter D5a toward one end, an outer diameter D5b (>D5a) toward the other end is larger. The outer diameter D5a toward the one end of the auxiliary wedge 14 is smaller than the inner diameter D2 of the external electrode terminal 11 and the outer diameter D5b toward the other end is larger than the inner diameter D2 of the external electrode terminal 11 (D5a<D2<D5b). One end 14a of the auxiliary wedge 14 smaller than the inner diameter D2 of the external electrode terminal 11 is inserted into the hollow part 12 of the external electrode terminal 11 (the insertion 42). The auxiliary wedge 14 has a function of applying pressure to the branches 11d of the through-hole insertion part 11c of the external electrode terminal 11, in a direction from the inside of the external electrode terminal 11 toward the outside the external electrode terminal 11.

The auxiliary wedge 14 has, on a conical surface (outer wall) (i.e., at a height position between an apex and a bottom of a cone), an outer diameter equal to the inner diameter D4 of the through-hole electrode 33. The auxiliary wedge 14 is inserted into the hollow part 12 of the external electrode terminal 11 to a depth position where the outer diameter D3 of the external electrode terminal 11 and the inner diameter D4 of the through-hole electrode 33 are equal (the insertion 42) (FIG. 4B). The insertion 42 of the auxiliary wedge 14 into the hollow part 12 of the external electrode terminal 11 presses and fixes the branches 11d of the through-hole insertion part 11c of the external electrode terminal 11 in the through-hole electrode 33. As a result, the external electrode terminal 11 and the through-hole electrode 33 may assuredly contact each other so that conduction of the external electrode terminal 11 and the through-hole electrode 33 is assuredly obtained. In place of the auxiliary wedge 14, a wedge (not depicted) may be used that may be inserted into the cut 13 and that has a tip thinner than a width of the cut 13 and another end that is thick.

A material of the auxiliary wedge 14 may be a material that does not easily deform or has a predetermined strength so as to enable the branches 11d of the through-hole insertion part 11c of the external electrode terminal 11 to be pushed against the through-hole electrode 33 by a constant load as described above. Additionally, a material of the auxiliary wedge 14 may be a material electrically insulated from the external electrode terminal 11. In particular, a material of the auxiliary wedge 14 may be, for example, Bakelite (registered trademark), a ceramic material, etc.

A method of assembly of the semiconductor device according to the first embodiment will be described with reference to FIGS. 1, 3, 4A, and 4B. First, the semiconductor chip 24 is bonded on the layered substrate 20 by, for example, paste solder. On the semiconductor chip 24 mounted on the layered substrate 20 or on the conductive plate 22, the one open end 1a of the main body part 1 of the cylindrical contact member 10, for example, is bonded by the solder 25 that is in a paste state. The conductive plate 22 on the layered substrate 20 and an electrode provided on the front surface of the semiconductor chip 24 are electrically connected by, for example, an aluminum wire.

Next, the main body part 1 of the cylindrical contact member 10 is inserted into the hollow part 12 of the external electrode terminal 11, from the open end 11e of the one end 11a of the external electrode terminal 11. The protruding part 3 provided on the outer wall 1c of the main body part 1 of the cylindrical contact member 10 is fitted into the external electrode terminal 11, thereby fixing the external electrode terminal 11 to the outside of the main body part 1 of the cylindrical contact member 10. Next, the other end 11b of the external electrode terminal 11 is inserted into the thru-hole 27 of the resin case 26 and protrudes outside the resin case 26. Next, the resin case 26 is adhered to a peripheral edge of the layered substrate 20 (or a peripheral edge of a heat sink), whereby the members on a surface of the layered substrate 20, the surface on the conductive plate 22 side, (or on the heat sink) are surrounded by the resin case 26 and thus, housed.

Next, the other end 11b of the external electrode terminal 11 is inserted into the through-hole 32 of the printed circuit board 31 (the insertion 41) (FIG. 3). Next, the auxiliary wedge 14 is inserted into the hollow part 12 of the external electrode terminal 11, from the open end 11f of the other end 11b of the external electrode terminal 11 (the insertion 42) (FIG. 4A). At this time, at the through-hole insertion part 11c of the external electrode terminal 11, the auxiliary wedge 14 is inserted to a depth position where the outer diameter D3 of the external electrode terminal 11 and the inner diameter D4 of the through-hole electrode 33 are equal (the insertion 42) (FIG. 4B). In this manner, the auxiliary wedge 14 is inserted (the insertion 42), whereby the branches 11d of the through-hole insertion part 11c of the external electrode terminal 11 are brought into contact with the through-hole electrode 33 and caused to conduct; and the external electrode terminal 11 is fixed to the printed circuit board 31. Thus, the semiconductor module depicted in FIG. 1 is completed.

As described, according to the first embodiment, on a layered substrate, a cylindrical contact member having a hollow cylindrical shape having an open end bonded by solder is inserted into a hollow part of an external electrode terminal, from one open end of the external electrode terminal having a hollow cylinder shape, and the external electrode terminal is fixed at an outer wall of the cylindrical contact member. Nothing need be inserted into a hollow part of the cylindrical contact member. As a result, the external electrode terminal may be fixed to the cylindrical contact member and mounted on the layered substrate without an occurrence of the crawling and dispersion of solder along the inner wall of the cylindrical contact member and without adverse effects due to the crawling or dispersion of solder along the inner wall of the cylindrical contact member.

Further, according to the first embodiment, the column surfaces of the branches separated and formed by inserting plural cuts in the end of the external electrode terminal (the end on the other open end side) have an arc shape (rounded shape) and no partial protrusion in a direction orthogonal to the central axis of the external electrode terminal is present. Therefore, when external electrode terminal is inserted into the through-hole of the printed circuit board, scraping of the through-hole electrode, damage, etc. may be suppressed. As a result, conduction defects of the external electrode terminal and the through-hole electrode may be suppressed.

Additionally, decreased insulation due to shavings of the through-hole electrode adhering to the printed circuit board or the semiconductor module may be suppressed.

Further, according to the first embodiment, an auxiliary wedge is inserted into a hollow part of the external electrode terminal, from the other open end side of the external electrode terminal, applying pressure to the branches of the through-hole insertion part of the external electrode terminal, in a direction from the inside toward the outside. As a result, the branches of the through-hole insertion part of the external electrode terminal may be assuredly fixed to the through-hole of the printed circuit board by a constant pressure, improving the strength of contact of the branches of the through-hole insertion part of the external electrode terminal and the through-hole electrode. Therefore, the external electrode terminal and the through-hole electrode may be assuredly connected. Additionally, the degree of design freedom for the shape, the dimensions, etc. of the branches of the through-hole insertion part of the external electrode terminal increases.

Figure 5:
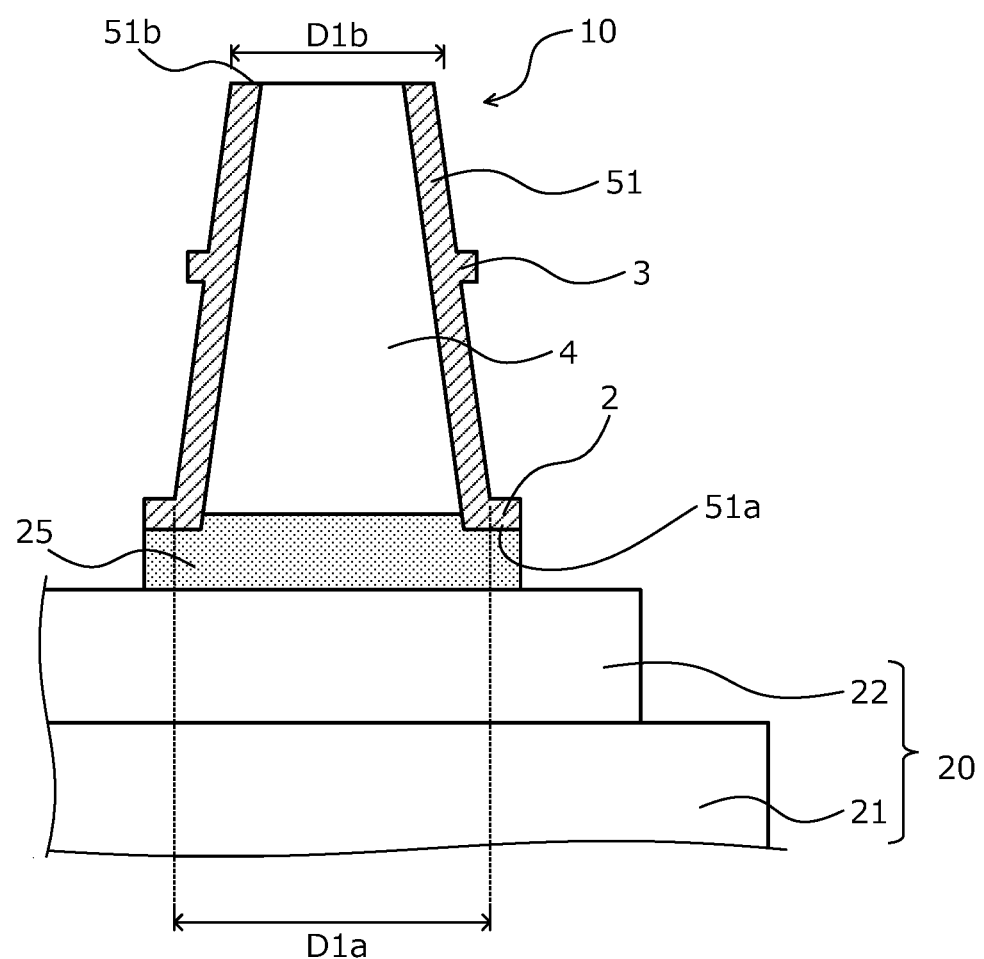
FIG. 5 is a cross-sectional view of a structure of the semiconductor device according to a second embodiment.

A structure of the semiconductor device according to a second embodiment will be described. FIG. 5 is a cross-sectional view of a structure of the semiconductor device according to the second embodiment. In FIG. 5, although the external electrode terminal, the printed circuit board, and the resin case are not depicted, similarly to the first embodiment, one end of the external electrode terminal having a hollow cylinder shape is fixed to an outside of a main body part 51 of the cylindrical contact member 10. Further, similarly to the first embodiment, the other end of the external electrode terminal is fixed to a through-hole of the printed circuit board by a part of the external electrode terminal protruding outside the resin case.

The semiconductor device according to the second embodiment differs from the semiconductor device according to the first embodiment with respect to a shape of the main body part 51 of the cylindrical contact member 10. In particular, the main body part 51 of the cylindrical contact member 10 is a member having, for example, a substantially circular truncated cone shape having a hollow cylinder shape with an outer diameter that narrows from one open end 51a side toward another open end 51b. An outer diameter D1a toward the one open end (lower end in FIG. 51a of the main body part 51 is the inner diameter D2 of the external electrode terminal or more, and an outer diameter D1b toward the other open end (upper end in FIG. 51b is less than the inner diameter D2 of the external electrode terminal (D1b<D2≤D1a). In other words, the main body part 51 has an outer diameter on the conical surface (outer wall) equal to the inner diameter D2 of the external electrode terminal.

As described, according to the second embodiment, effects similar to those of the first embodiment may be obtained. Further, according to the second embodiment, the main body part of the cylindrical contact member has a substantially circular truncated cone shape, whereby the external electrode terminal is fixed on the outside conical surface of the main body part of the cylindrical contact member. Therefore, the external electrode terminal may be stably fixed to the outer wall of the main body part of the cylindrical contact member, irrespective of variations in dimensional accuracy of the main body part of the cylindrical contact member.

The present invention is not limited to the embodiments above and various modifications are possible within a range not deviating from the spirit of the invention.

According to the inventions above, a metal member having a hollow cylindrical shape is inserted inside a metal electrode member (hollow part), from one open end of the metal electrode member having a hollow cylindrical shape, enabling the metal electrode member to be fixed at an outer wall of the metal member inserted inside the metal electrode member. Therefore, even when crawling or dispersion of solder onto the inner wall of the metal member occurs, the metal electrode member may be fixed to the metal member and be mounted on an insulated substrate without being adversely affected by the solder that crawls or is dispersed onto the inner wall of the metal member.

Further according to the inventions above, since the column surface of the branches separated and formed by cuts inserted in the end part of the other open end side of the metal electrode member has an arc shape, when the metal electrode member is inserted in the through-hole of the circuit board, scraping of the through-hole electrode may be suppressed. Therefore, decreases in insulation due to shavings of the through-hole electrode may be prevented. Further, according to the present inventions above, due to the wedge inserted from the other open end of the metal electrode member, the branches of the metal electrode member may be assuredly fixed in the through-hole of the circuit board by a constant pressure.

The semiconductor device, the metal electrode member, and the method of manufacturing a semiconductor device according to the present invention achieve effects in that assembly defects associated with connection of the external electrode terminal and other members may be eliminated.

As described, the semiconductor device, the metal electrode member, and the method of manufacturing a semiconductor device according to the present invention is useful for semiconductor devices such as semiconductor modules having a configuration in which a semiconductor chip and other component members, etc. are bonded by solder to a conductive plate of a surface of a layered substrate.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A semiconductor device, comprising:
   an insulated substrate;
   a conductive plate or a semiconductor chip mounted on the insulated substrate;
   a metal member that comprises a hollow cylinder having open ends, one open end being bonded by solder to the conductive plate or the semiconductor chip; and
   a metal electrode member that comprises a hollow cylinder having open ends, that has inserted therein, through one open end of the metal electrode member, a part of the metal member including another open end of the metal member that is opposite to the one open end, that is fixed to at least a portion of the part of the metal member, and that is configured to externally lead out potential of the conductive plate or the semiconductor chip via the metal member.

2. The semiconductor device according to claim 1, wherein the metal member has an outer wall having an outer diameter, and wherein the metal electrode member has an inner wall having an inner diameter that is larger than the outer diameter of the outer wall of the metal member.

3. The semiconductor device according to claim 1, wherein the metal member has an outer wall that is provided with a protruding part that protrudes outwardly from the outer wall, and wherein the metal electrode member has an inner wall that is in contact with the protruding part and fixed to the metal member.

4. The semiconductor device according to claim 1, wherein the hollow cylinder of the metal electrode member has a central axis, wherein a part of the metal electrode member that is proximate another open end of the hollow cylinder thereof and opposite to the one end into which the metal member is inserted, has defined therein a plurality of cuts that are parallel to the central axis and that form a plurality of branches separated respectively by the plurality of cuts, and wherein the part is configured for insertion into a through-hole of a circuit board.

5. The semiconductor device according to claim 4, wherein the plurality of branches forms a columnar arc shape having a column surface formed by a generatrix extended in a direction parallel to the central axis and having an arc shaped surface with a periphery that is orthogonal to the central axis.

6. The semiconductor device according to claim 4, wherein the through-hole of the circuit board has an inner wall in which is provided a through-hole electrode having a ring shape and an inner diameter, and wherein the plurality of branches is configured to be fixed to the inner wall of the through-hole with a wedge inserted through the another open end of the hollow cylinder of the metal electrode member.

7. The semiconductor device according to claim 6, wherein the wedge has a cone shape having on a conical surface, and wherein the conical surface has an outer diameter that is the same as the inner diameter of the through-hole electrode.

8. The semiconductor device according to claim 6, wherein the through-hole electrode has an inner diameter, and wherein the metal electrode member has an outer diameter that is smaller than the inner diameter of the through-hole electrode.

9. The semiconductor device according to claim 1, wherein the metal electrode member has an inner diameter, wherein the metal member has a circular truncated cone shape having an outer diameter that narrows from one open end thereof toward another open end thereof, wherein the metal member has an outer diameter at the one open end thereof that is at least as large as the inner diameter of the metal electrode member, and wherein the metal member has an outer diameter at the another open end thereof that is less than the inner diameter of the metal electrode member.

10. A method of manufacturing a semiconductor device according to claim 1, the method comprising:
bonding by solder the one open end of the metal member to the conductive plate or the semiconductor chip; and
inserting into one open end of the metal electrode member, an end part of the metal member including another open end thereof and fixing the metal electrode member to the metal member.

11. The method according to claim 10, wherein the metal member has an outer diameter, and wherein the metal electrode member has an inner diameter that is larger than the outer diameter of the metal member.

12. The method according to claim 10, wherein inserting the end part of the metal member and fixing the metal electrode member to the metal member includes providing a protruding part that protrudes outwardly from an outer wall of the metal member, contacting an inner wall of the metal electrode member and the protruding part, and fixing the metal electrode member to the metal member.

13. The method according to claim 10, further comprising:
providing a circuit board in which is defined a through-hole having an inner wall;
inserting into the through-hole of the circuit board an end part of the metal electrode member that includes another open end thereof that is opposite the one open end thereof into which the end part of the metal member is inserted; and
inserting a wedge into the end part of the metal electrode member through the another open end thereof and fixing the end part to the inner wall of the through-hole with the wedge.

14. The method according to claim 13, further comprising:
providing a through-hole electrode along an inner wall of the through-hole of the circuit board; and
defining a plurality of cuts in the end part of the metal electrode member parallel to a central axis of the metal electrode member to form a plurality of branches separated by the plurality of cuts,
wherein inserting the wedge and fixing the end part includes fixing the plurality of branches to the inner wall of the through-hole with the wedge, and connecting the plurality of branches to the through-hole electrode provided along the inner wall of the through-hole.

15. The method according to claim 14, wherein the plurality of branches forms a columnar arc shape having a column surface formed by a generatrix extended in a direction parallel to the central axis of the metal electrode member and having an arc shaped surface with a periphery that is orthogonal to the central axis of the metal electrode member.

16. The method according to claim 14, wherein the wedge has a cone shape having on a conical surface, and wherein the conical surface has an outer diameter that is the same as the inner diameter of the through-hole electrode.

17. The method according to claim 14, wherein the through-hole electrode has an inner diameter, and wherein the metal electrode member has an outer diameter that is smaller than the inner diameter of the through-hole electrode.

18. The method according to claim 10, wherein the metal electrode member has an inner diameter, wherein the metal member has a circular truncated cone shape having an outer diameter that narrows from the one open end thereof toward the another open end thereof, wherein the metal member has an outer diameter at the one open end thereof that is as large as the inner diameter of the metal electrode member, and wherein the metal member has an outer diameter at the another open end thereof that is less than the inner diameter of the metal electrode member.

* * * * *